US009890450B2

(12) United States Patent
Ramm et al.

(10) Patent No.: US 9,890,450 B2
(45) Date of Patent: Feb. 13, 2018

(54) METHOD FOR STRUCTURING LAYER SURFACES

(71) Applicant: Oerlikon Surface Solutions AG, Trubbach, Trubbach (CH)

(72) Inventors: Jurgen Ramm, Maienfeld (CH); Beno Widrig, Bad Ragaz (CH); Matthias Lukas Sobiech, Wasserburg (DE); Doris Fopp-Spori, Landquart (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 169 days.

(21) Appl. No.: 14/647,911

(22) PCT Filed: Nov. 28, 2013

(86) PCT No.: PCT/EP2013/003595
§ 371 (c)(1),
(2) Date: Sep. 15, 2015

(87) PCT Pub. No.: WO2014/082746
PCT Pub. Date: Jun. 5, 2014

(65) Prior Publication Data
US 2016/0002767 A1    Jan. 7, 2016

(30) Foreign Application Priority Data
Nov. 29, 2012 (DE) .................. 10 2012 023 260

(51) Int. Cl.
C23C 14/32 (2006.01)
C23C 14/14 (2006.01)
C23C 14/06 (2006.01)
C22C 27/04 (2006.01)
H01J 37/32 (2006.01)

(52) U.S. Cl.
CPC .............. *C23C 14/14* (2013.01); *C22C 27/04* (2013.01); *C23C 14/0641* (2013.01); *C23C 14/325* (2013.01); *H01J 37/3255* (2013.01); *H01J 37/32614* (2013.01)

(58) Field of Classification Search
CPC ..... C23C 16/4485; C23C 14/24; C23C 14/32; C23C 14/325
See application file for complete search history.

(56) References Cited

U.S. PATENT DOCUMENTS

| 6,331,332 B1 * | 12/2001 | Wang ............... C23C 14/0605 427/249.18 |
| 6,544,357 B1 * | 4/2003 | Hehmann ............... C23C 14/14 148/420 |
| 2003/0175200 A1 * | 9/2003 | Smalley ............... B82Y 30/00 423/447.3 |

FOREIGN PATENT DOCUMENTS

| EP | 0 668 369 B1 | 8/1995 |
| JP | 2005-153072 A | 6/2005 |
| WO | 03/091474 A1 | 4/2003 |
| WO | 2012/102374 A1 | 8/2012 |

OTHER PUBLICATIONS

Wang, Da-Yung, et al., "Study on metal-doped diamond-like carbon films synthesized by cathodic arc evaporation". Diamond and Related Materials 9 (2000) 1762-1766.*
Kuroyanagi, Akio, et al., "Properties of Aluminum-Doped ZnO Thin Films Grown by Electron Beam Evaporation". Japanese Journal of Applied Physics, vol. 28, No. 2, Feb. 1989, pp. 219-222.*
Miyata, Toshihiro, et al., "Preparation of transparent conductinv B-doped ZnO films by vacuum arc plasma evaporation". J. Vac. Sci. Technol. A 25(4), Jul./Aug. 2007, pp. 1193-1197.*
Chiu, Ming-Chieh, et al., "Thermal stability of Cr-doped diamond-like carbon films synthesized by cathodic arc evaporation". Thin Solid Films, 476 (2005) 258-263.*
Pohler, et al., "Cathodic Arc Deposition of (Al,Cr)0: Macroparticles and Cathode Surface Modifications", Surface and Coatings Technology, Elsevier, Amsterdam, NL, Bd. 206, Nr. 6, Sep. 12, 2011, Seiten 1454-1460.
Ozturk, et al., "Comparative Tribological Behaviors of TiN? and MoN?Cu Nanocomposite Coatings", Tribology International, Butterworth Scientific Ldt, Guildford, GB, Bd. 41, Nr. 1, Sep. 18, 2007, Seiten 49-59.
Suszko, et al., "Mo2N/Cu Thin Films—The Structure, Mechanical and Tribological Properties", Surface and Coatings Technology, Elsevier, Amsterdam, NL, Bd. 200, Nr. 22-23, Jun. 20, 2006, Seiten 6288-6292.
International Search Report for PCT/EP2013/003595 dated Apr. 30, 2014.

* cited by examiner

*Primary Examiner* — Bret Chen
(74) *Attorney, Agent, or Firm* — Pearne & Gordon LLP

(57) ABSTRACT

A coating method based on gas phase deposition by arc evaporation, with the steps: selecting a first target as a material source for the coating; providing a coating chamber with an arc evaporation source including the selected target; loading the chamber with substrates to be coated; pumping down the chamber to a process pressure suitable for the arc evaporation; and igniting and operating the arc such that material is evaporated from the first target and is then deposited on the substrates to be coated, optionally after reaction with a reactive gas admitted into the coating chamber. The first target includes at least one matrix component and one doping component such that the doping component has a melting point at least 500° C. lower than the matrix component, and a melted drop of the doping component on a solid surface of the matrix component assumes a contact angle of a least 90°.

11 Claims, 8 Drawing Sheets

METHOD FOR STRUCTURING LAYER SURFACES

The present invention relates to a method for coating substrates based on gas phase deposition by means of arc evaporation, with which a structured surface is to be obtained.

Structured surfaces with structure sizes in the micrometer and nanometer range are needed in various fields of application. For example, structures are known that are generated on silicon wafers to produce semiconductor components. These structures are achieved by means of elaborate lithographical processes and consist of several process steps. There are also methods in which the surface structuring takes place using laser or a focused ion beam. These methods also require a great technological effort. Massler et al. in Wo2003091474 disclose such a structured layer system for workpieces, in particular for tools or components with a function surface executed as a sliding surface.

For cost reasons, the methods mentioned above are used never or only in selected cases for the structuring of surfaces for tribological applications, for example in the field of coated tools or components or for adjusting the wettability of surfaces on substrates that are made for example of plastic. Yet in this respect, such structuring would be desirable and of commercial importance in many cases and for considerably broader fields of application. For example, the "troughs" in a surface structured in this way could serve as reservoir for lubricating agents, which as a consequence would reduce the friction value, decrease friction losses and results in the end in a reduced expenditure of energy. By way of lubricating agents, a lubricant could be considered, i.e. an oil or grease. But surfaces structured in this manner can also be useful in combination with low-melting materials, especially with the aim of optimizing tribological systems at increased temperatures. The materials with low melting points can be liquidized, depending on the contact conditions, and fulfill a similar function as the oils and greases, except simply at higher temperatures. "Trough" structures can however also be useful for adjusting wetting mechanisms, i.e. could serve for example for use in the field of decorative surfaces or for surfaces for medical applications.

It is however not only the economic aspects that prevent an application on a larger scale of the methods described above for tribological applications. The lithographic structuring methods in semiconductor technology have been developed for example for a substrate material, namely silicon, and for a material to be structured, namely SiO2. Changes of material require in turn a completely new structuring method, e.g. plasma etching [Sze 1, pp. 304] for structuring nitrides or metallic circuit paths for semiconductors. It is understandable that this can hardly be achieved for tribological applications. The diversity of the metallic and of the most varied ceramic substrate materials simply do not allow this on a large scale.

BRIEF SUMMARY OF THE INVENTION

An aim of the invention is therefore that a structured substrate surface can be produced essentially independently of the substrate material.

A further aim of the invention is that the structure properties of the surface can be modified and optimized by means of the method of production, i.e. for example the surface density of the structures or their dimension.

A further aim of this invention is that the structuring requires either no further process step or merely a small post-treatment needs to be performed in order to obtain the desired structures.

A special further aim of the invention (without however being restricted to this field of application) is to achieve that such a surface, in addition to a high resistance to wear and tear, has a very low friction value, i.e. that it can be used for optimizing tribological systems.

A special further aim of the invention is by applying such a layer, to alter the surface topography in such a manner that the wetting characteristics can be modified in a targeted fashion.

A further aim of the invention is that the structuring takes place simultaneously with the deposition of a thin layer resp. that the deposited layer forms the structure.

The task is solved by a PVD coating by means of cathodic spark evaporation, wherein a target is used as cathode and whose chemical composition makes the surface structuring possible.

The task is solved according to the invention in that the composition of the target consists of at least two elements, wherein one of them melts at low temperature and the other at high temperature.

The components forming the target should be of at least two elements that are very different in terms of the vapor pressure at approx. 1 Pa.

The components forming the target should furthermore comprise at least two elements that are very different in terms of their melting point.

The invention allows the production of a structured layer on a substrate material that can be coated by means of spark evaporation, i.e. that the substrate materials can be selected from a plurality of metallic and ceramic materials and even plastic materials are suitable.

The structured layer can be both of metallic nature or comprise a combination of ceramic and metallic nature, i.e. for example a nitride, carbide or oxide and combinations of these materials.

The invention is based on structures that are embedded in a matrix layer surface during the coating, this being "trough structures" (concave) with an approximately circular section. The density, the depth and the diameter of these structures can be determined by the components comprising the target.

The invention rests, on the one hand, on the fact that spatters are increasingly and reproducibly formed at the target and, on the other hand, on the fact that these spatters on the substrate are embedded merely loosely on the growing layer and are then either pushed out of the layer by themselves during the layer growth or can subsequently be removed using a simple post-treatment.

A further aspect of the invention, which is relevant especially for tribological applications, is the limited solubility of the low-melting target component in the high-melting target component.

DESCRIPTION OF THE INVENTION

Cathodic spark evaporation is a process well known to the one skilled in the art for coating different substrates and substrate materials with thin layers. In this process, a target is connected as cathode in a spark discharge and, through the effect of the spark operated on the target, the target material is evaporated. The basics of this coating process can be read in detail in the literature. Cathodic spark evaporation makes possible both the production of metallic layers (i.e. an evaporation of the target material without reactive gas) as well as the production of ceramic layers by using reactive gases such as for example nitrogen, oxygen, hydrocarbons, gases containing Si. If for example a Mo target (Mo stands for molybdenum) is evaporated by means of cathodic spark in a nitrogen atmosphere, a Mo—N layer forms onto the substrate surface whose composition and phases depend on process parameters such as for example the flow of nitrogen, the Mo-evaporation rate, the substrate temperature among others. Such a layer can have a great hardness (between 15 Gpa and 35 GPa) and can be used for applications in the field of protection against wear and tear on tools and components.

If no elementary target such as the previously mentioned Mo target is used for cathodic spark evaporation but a target consisting of at least two elements (so-called mixed target), these at least two elements will accordingly also pass into the layer synthesis. For wear and tear reduction applications on tools and components, TiAlN and AlCrN layers for example are usually produced with the corresponding mixed targets consisting of Al—Ti or Al—Cr. These coatings protecting against wear and tear are well known to the one skilled in the art.

Reactive cathode spark evaporation is in fact a coating technology widely introduced in production. In addition to the many advantages of this technology, there is however also a generally acknowledged great disadvantage: cathodic spark evaporation, due to the cathodic spark, produces during the evaporation of the target material a number of spatters that are integrated in the deposited layer. These spatters in many cases require a post-treatment of the coated surfaces. This post-treatment has been state of the art for many years and is used for example for cutting tools for which it is advantageous to reduce the surface roughness in order to achieve a better performance of the tools. For the typical layers in the protection against wear and tear, these spatters are mostly hard and have an abrasive effect on the counter-body in tribological contact. This is not a problem for example in the case of cutting tools, as long as the outbreak of the spatters does not result in layer failure. The size of the spatters and their integration into the layer matrix varies and the strength of the integration in it is generally sufficiently good yet not really controllable. There is generally a wish for spatter-free layers. However, since typically spatters are always generated in the case of spark evaporation without special filters, there is a wish for them to be at least "well" anchored within the layer, so that they can be "overgrown" during the course of the layer synthesis. FIGS. 1a and 1b show a cross section view across a layer (here an Al—Ni—O layer), taken in a scanning electron microscope at different degrees of enlargement. The layer was deposited by means of cathodic spark evaporation from a mixed Al—Ni target in oxygen atmosphere on an indexable cutting insert of tungsten carbide. In the FIG. 1a, it can be seen that the layer surface has a great roughness and in the cross section of the layer, the spatters can be seen that are integrated in the layer (encircled areas). But other spatters can also be observed that have not yet been overgrown and are partly removed (in rectangles) when the samples are broken. The density of the spatters in and on the layers that are produced by means of unfiltered spark technology depends among others on the components of which the mixed targets are constituted. However, it is essentially possible to always observe the integration of spatters in the layer and also the subsequent overgrowth of the spatters.

The spatter integration is also to be shown in the case of another layer system. In FIGS. 1c and 1d, a layer system consisting of an Al—Ti—N layer and an Al—Cr—O top layer is shown. The total layer thickness of the layer system is approx. 10 µm, wherein the topmost approx. 3 µm are the Al—Cr—O top layer. On the figures, the following can be seen: the spatter density is obviously lower in the bottom part of the layer system, i.e. in the Al—Ti—N layer. It increases during the transition (dotted line) from the Al—Ti—N layer into the Al—Cr—O layer, wherein especially very many spatters are generated in this transition area. But here too the principle applies that the spatters are overgrown through the later layer or integrated within these. In FIG. 1d, the integration of the spatters in the Al—Ti—N layer is shown again at yet a greater level of magnification.

It was therefore surprising that during spark evaporation with mixed targets of Mo (85 at %)-Cu (15 at %) there were other results in terms of the integration of spatters. Mo—Cu—N layers were produced under a reactive gas pressure of 4 Pa. It was found that during spark evaporation while using a Mo—Cu target, the cathode spark generated a plurality of spherical spatters that were not integrated in the deposited layer. This can be recognized when observing the FIGS. 2a to 2c, which show photographs of the layer surface in the scanning electron microscope. On the layer surface, a number of spherical spatters of various diameters can be discerned. The diameters vary. Some have a diameter in the micrometer range and there are some comparatively few larger spatters whose diameter can be as large as approx. 10 micrometer. Additionally, there are many more small spatters in the sub-micrometer range, for example around 100 nm or below that. In the figure, hole structures can also be observed in the layer surface. Hole structures having a diameter in the micrometer range can be seen most clearly. These hole structures have obviously been caused by those spatters whose adherence to the layer matrix was so insufficient as to cause them to be pushed out of the layer during and because of the layer growth and the forces arising therefrom. The inventors do not know the exact reason for the loose integration of the spatters. It must however be assumed that the spatter material wets the Mo—(Cu)—N matrix layer poorly and therefore the formation of spherical spatters is enhanced. Linked thereto is also the claim that the spatter material binds poorly or not at all with the matrix material.

To summarize, it can be said that as a result of the evaporation of a Mo—Cu target with cathodic spark a layer surface is provided which is characterized by a plurality (in terms of size) of different hole structures, whose surface density is essentially determined by the number of spatters. The size (diameter) of the hole structures depends on the size of the spatters. The frequency and size of the spatters thus essentially determine the surface structure of the layer. What is important for the structuring of the layer surface is the fact that the majority of the spatters are integrated only loosely or not at all into the layer surface. This poor adhesion of the spatters in the matrix layer leads already during the layer growth to the spatter loss, which exposes the hole structures. Should these spatters however remain loosely adhering, they can be removed with a simple polishing step. A substrate surface treated through such a short polishing step is represented in the surfaces of a Mo—Cu—N layer shown by means of scanning electron microscope in the FIGS. 3a to 3c. The FIGS. 3a and 3b clearly show that the spatters were removed and have left a hole structure. In FIG. 3c, however, another possibility is shown as to what might happen with the spatters after the polishing step: in case they are soft enough, they are partly smeared into the hole structures.

Mostly, however, this results in the spatters being removed in the polishing step and in the surface structuring resulting therefrom.

The following conditions must therefore be fulfilled, in order to yield a surface structuring during the coating. First, a method is necessary that reliably produces spatters in a form defined to a certain extent. This means that during the cathodic spark evaporation, processes are provoked on the target surface in a targeted manner that are suitable for increasingly producing spatters. On the other hand, these spatters may not become integrated firmly in the matrix layer, i.e. not promote the porosity of the layer matrix, so that they can be removed already during the layer growth or can be removed through a post-treatment in a simple manner and without noteworthy losses of the matrix layer.

Using the example of the Mo—Cu material system and with the aim of the figures, we shall now attempt to explain in more detail what was said here above.

BRIEF DESCRIPTION OF THE DRAWINGS

In this connection, the figures and tables show the following:

FIG. 2b magnified extract from 2a;

FIG. 3b figure of a polished Mo—Cu—N layer surface in the scanning electron microscope in another enlargement than in FIG. 3a;

Table 1 matrix elements and doping element;

Table 2 melting points and vapor pressure of the matrix elements;

Table 3 melting points and vapor pressure of the doping elements;

Table 4 low-melting oxides and nitrides or those with high vapor pressure.

Figure 1A:
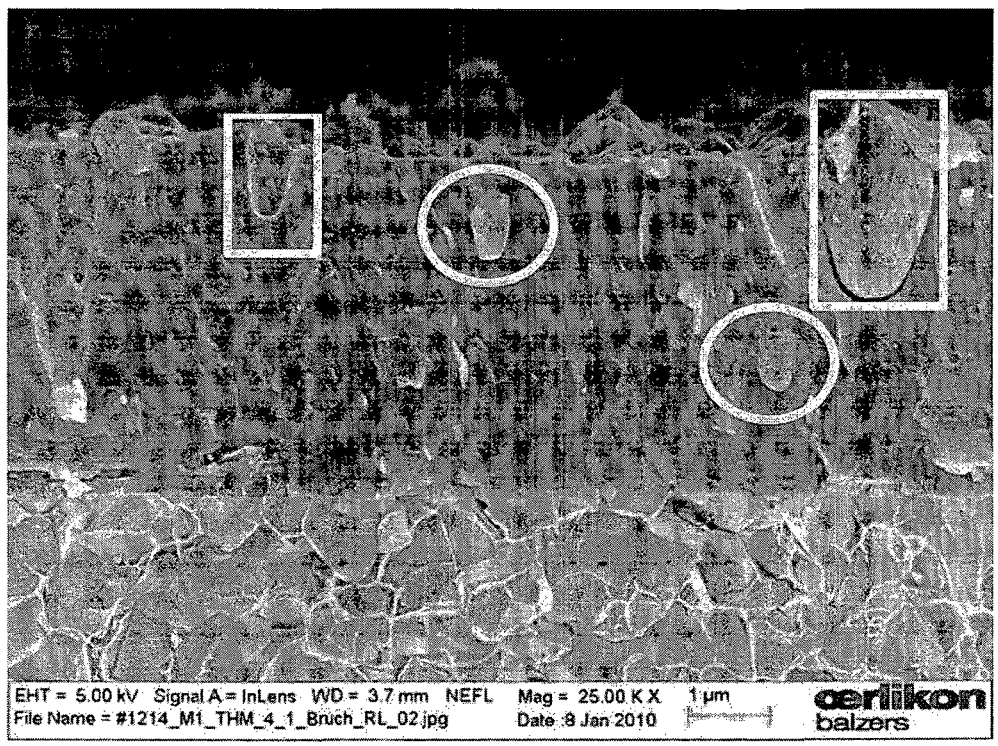
FIG. 1a scanning electron microscope figure showing a cross section through an Al—Ni—O layer.
Figure 1B:
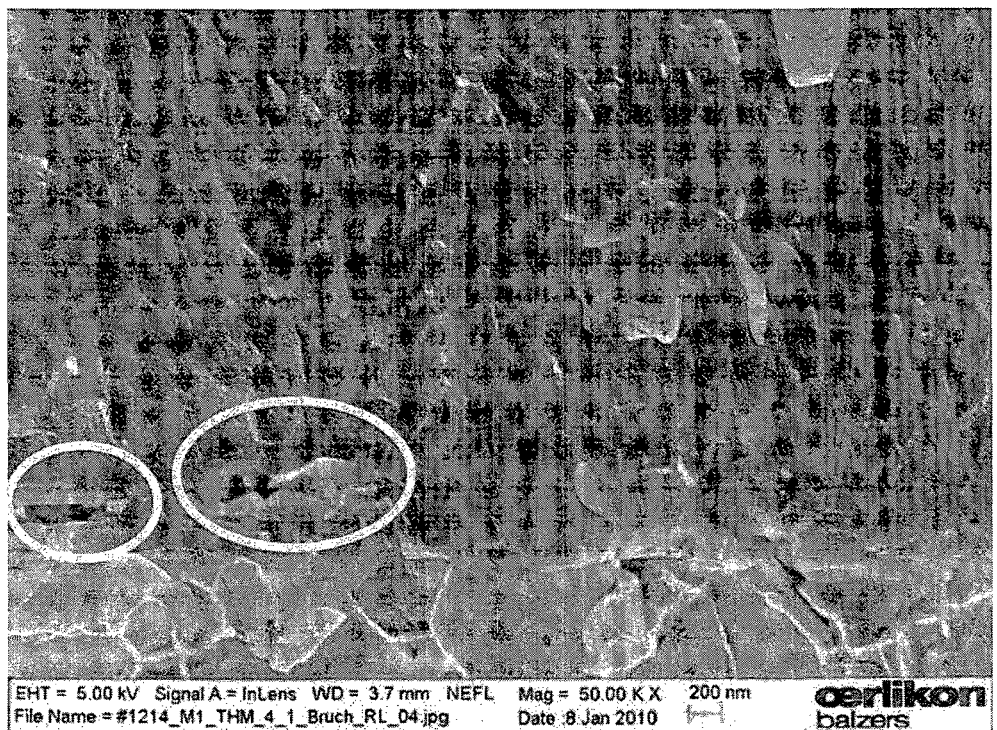
FIG. 1b figure according to FIG. 1a with another degree of enlargement.
Figure 1C:
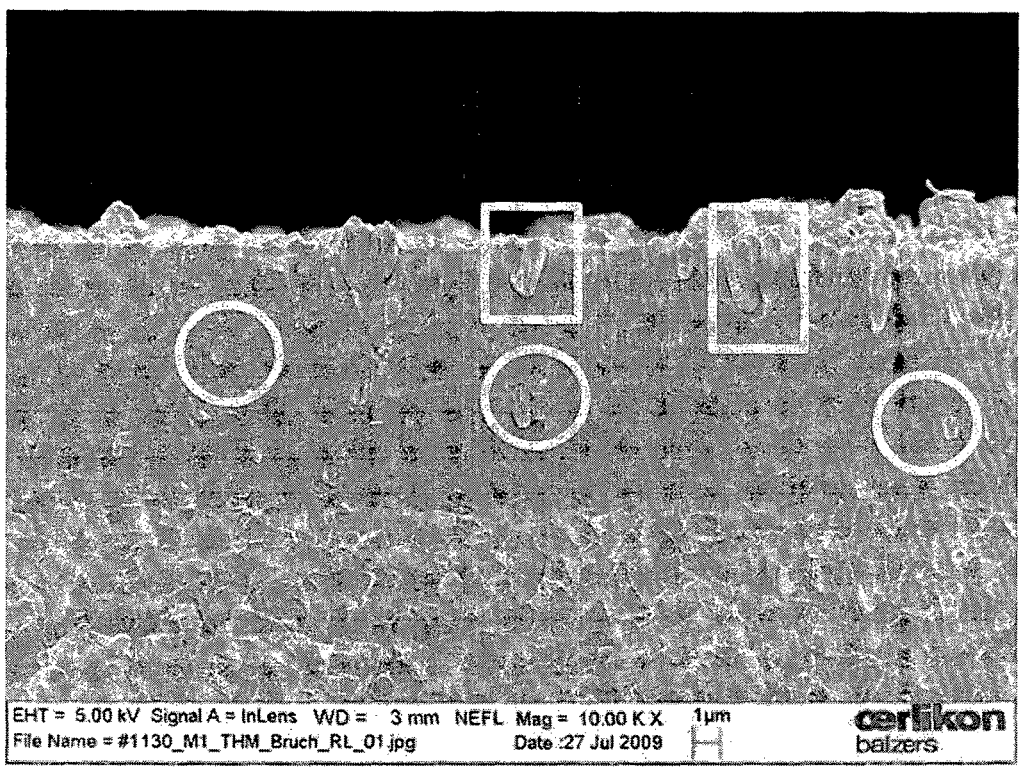
FIG. 1c scanning electron microscope figure showing a cross section through an Al—Ti—N layer FIG. 1d figure according to FIG. 1c with another degree of enlargement.
Figure 1D:
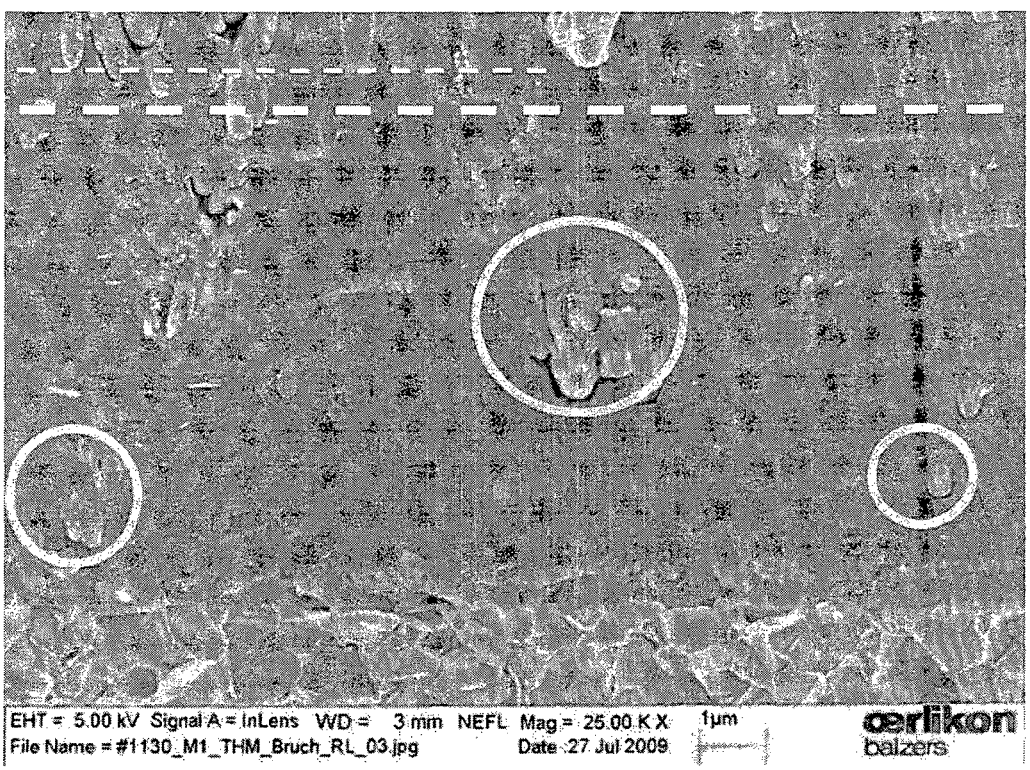
Figure 2A:
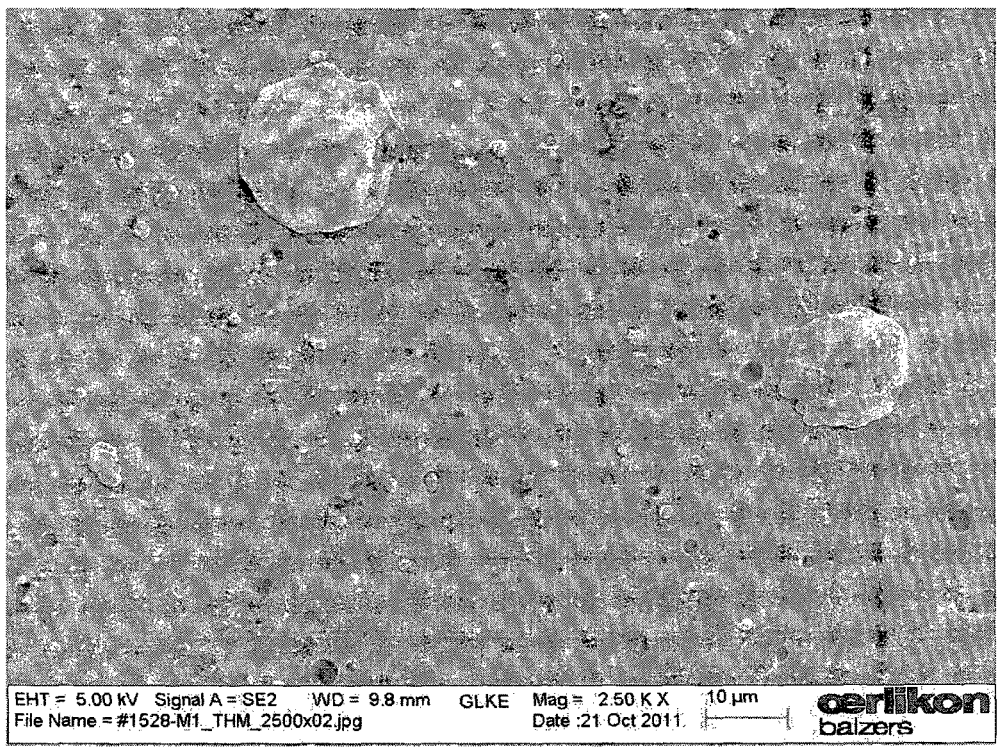
FIG. 2a figure of a Mo—Cu—N layer surface in the scanning electron microscope.
Figure 2B:
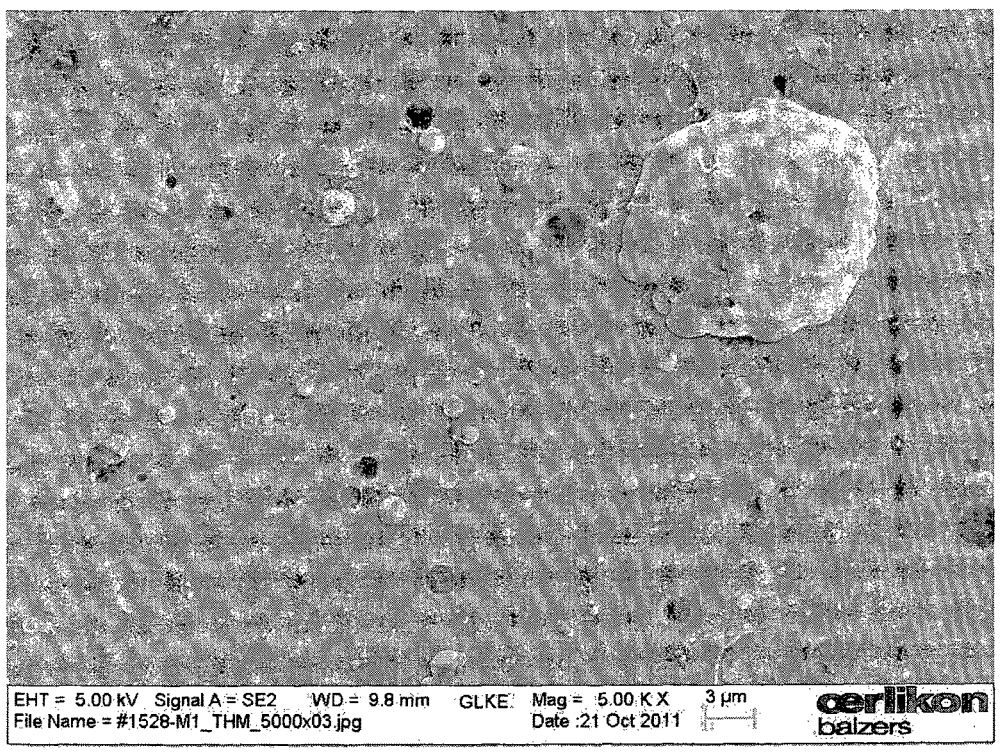
Figure 2C:
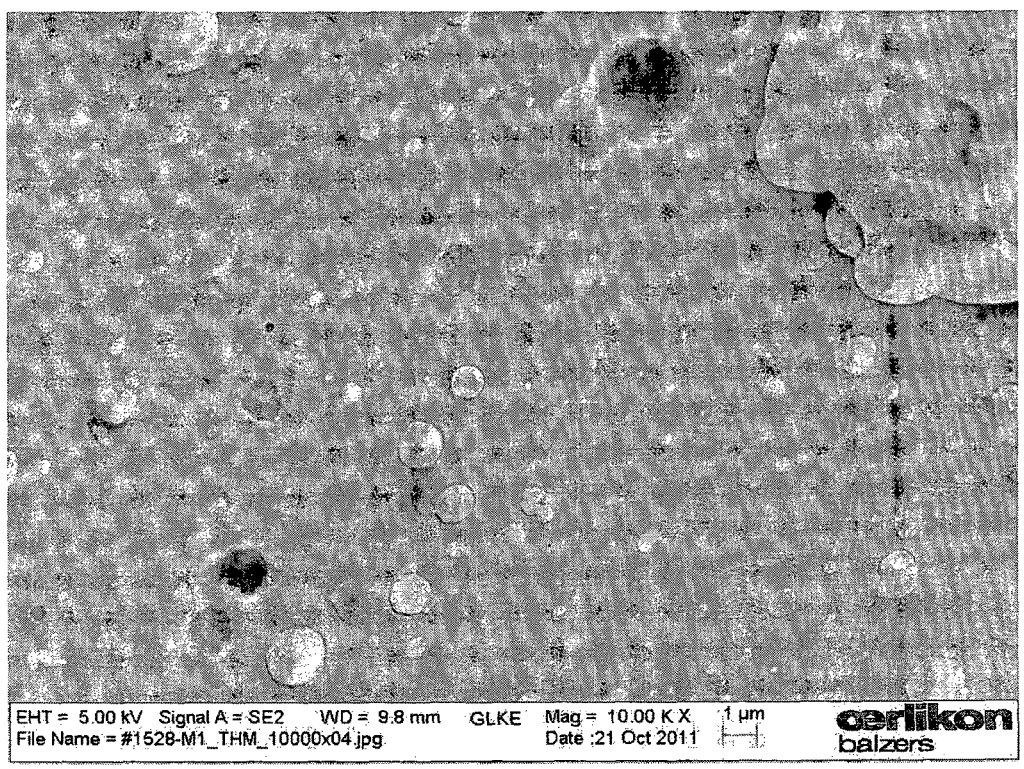
FIG. 2c magnified extract from 2b.
Figure 3A:
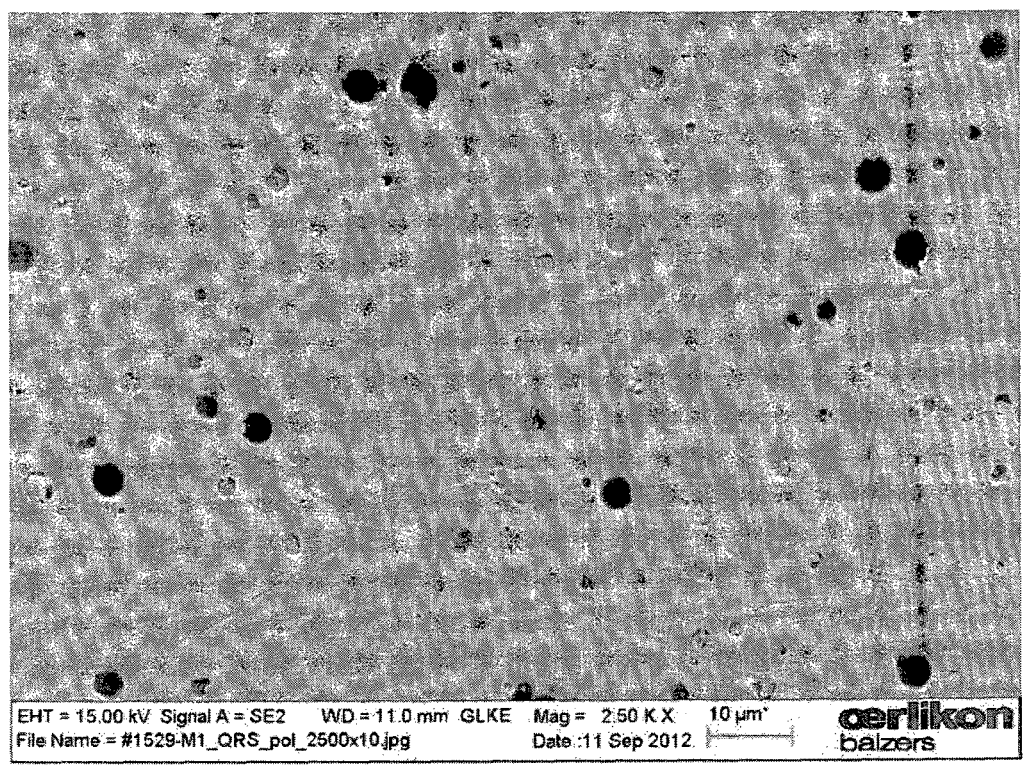
FIG. 3a figure of a polished Mo—Cu—N layer surface in the scanning electron microscope.
Figure 3B:
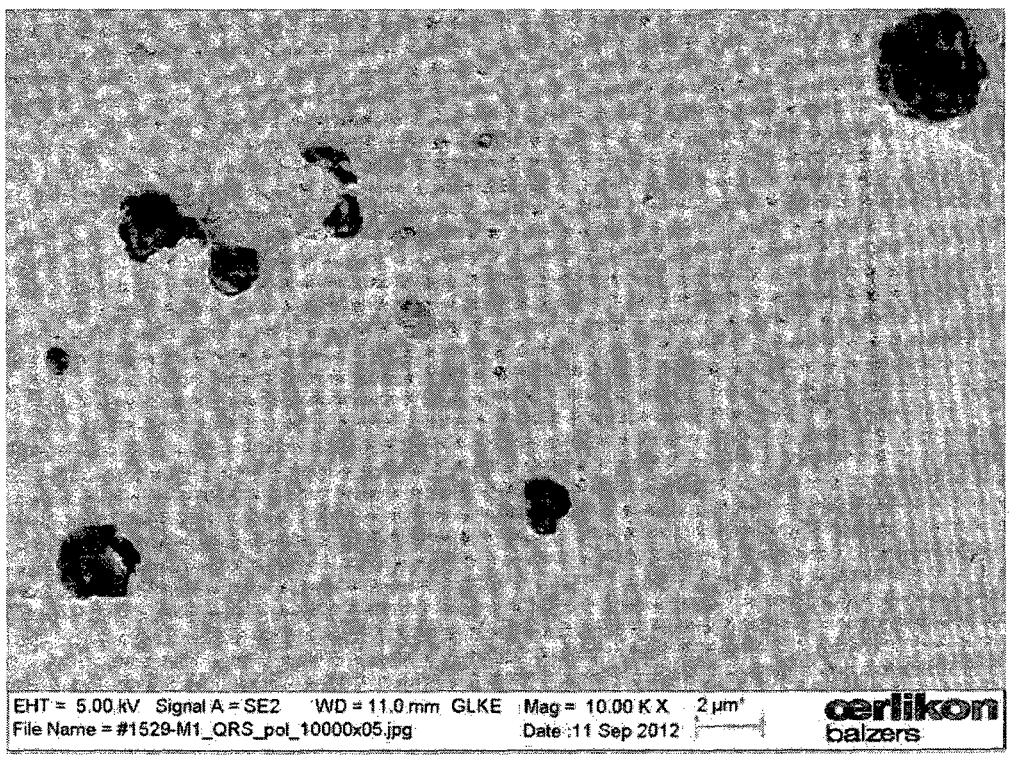
Figure 3C:
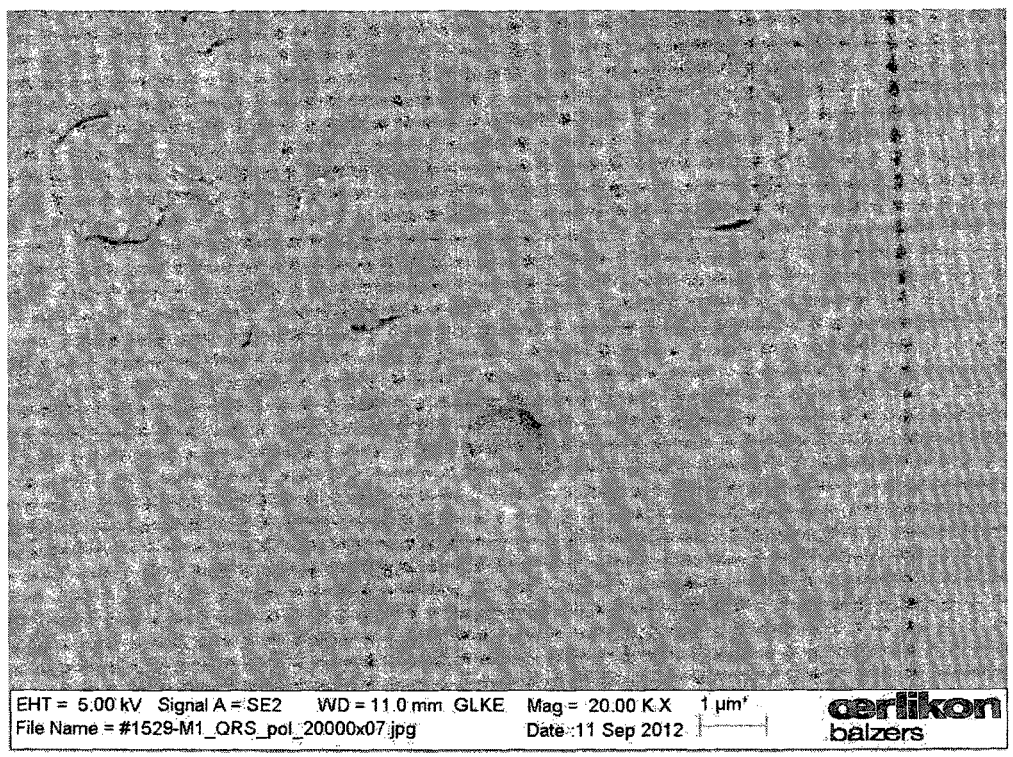
FIG. 3c figure of a polished Mo—Cu—N layer surface in the scanning electron microscope.
Figure 4:
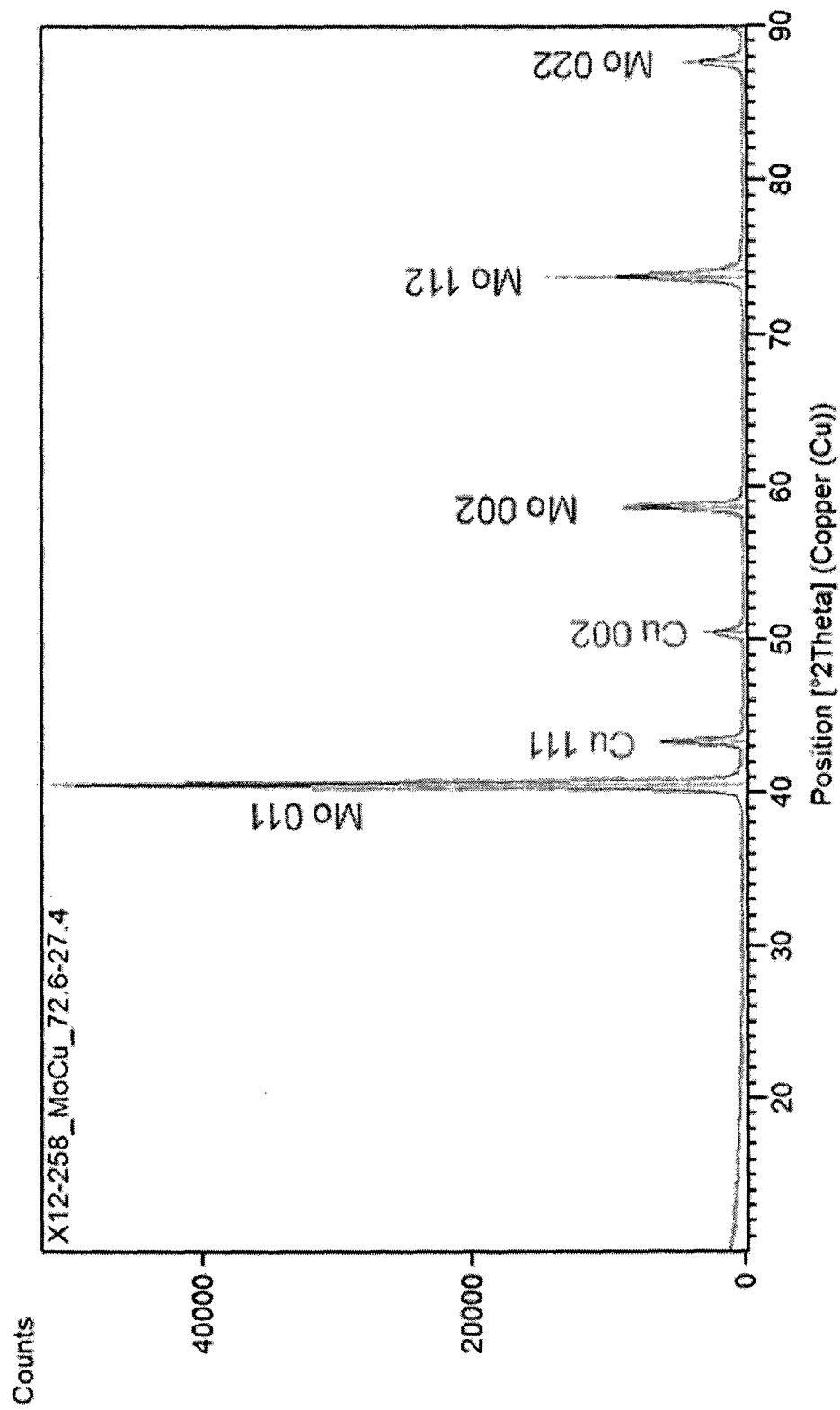
FIG. 4 X-ray diffraction (XRD) Rietvelt analysis of an unused Mo—Cu target.

First, the processes at the target surface are described. It is known that mixed targets can be produced from metallic powders. The exact production methods, namely the compaction and temperature treatments, are specifically adapted to particular material compositions. In this manner, target compositions are produced such as Al—Cr or Ti—Al known to the one skilled in the art with which for example coatings for protection against wear and tear of tools are produced, as has already been explained further above. In a quite similar manner, Mo—Cu targets were then produced in a different composition. The inventors investigated targets with Cu contents up to 30 at %, wherein targets with greater Cu proportions are also possible. The unused targets were subjected to an analysis in terms of their composition, both with EDX, XRF as well as with XRD (Rietvelt analysis). The respective target composition indicated by the manufacturer were confirmed through these analysis procedures. Smaller deviations between the results of the analysis procedures can be explained because of the different depth resolutions of the analysis methods and deviations from the theoretical target density. The XRD examinations clearly show the presence of Mo and Cu at the target surface and up to the depths that are reached by the analysis methods, i.e. on the order of one micrometer. By way of example, FIG. 4 shows such an XRD Rietvelt analysis on an unused Mo—Cu target that was found for a composition of Mo (73 at %)-Cu (27 at %), which corresponded to the manufacturer's specifications. In the same way, the manufacturer's indications were confirmed for targets for the nominal compositions of Mo (85 at %)-Cu (15 at 5%) and Mo (95 at %)-Cu (5 at %).

Figure 5A:
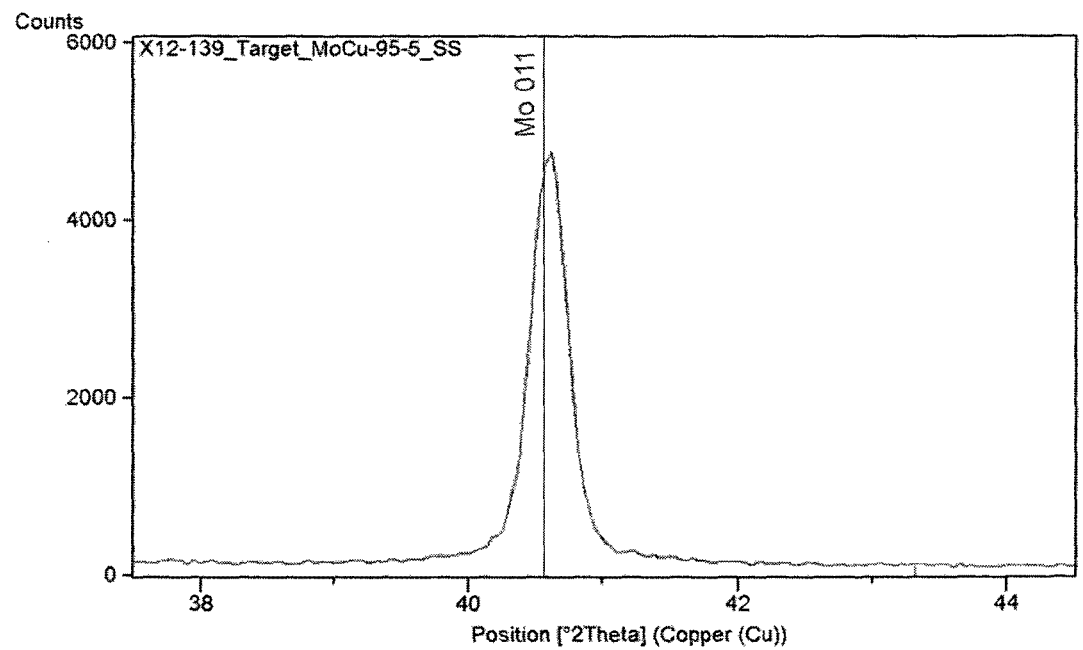
FIG. 5a extract of an XRD analysis of a Mo—Cu target after a one-hour use.
Figure 5B:
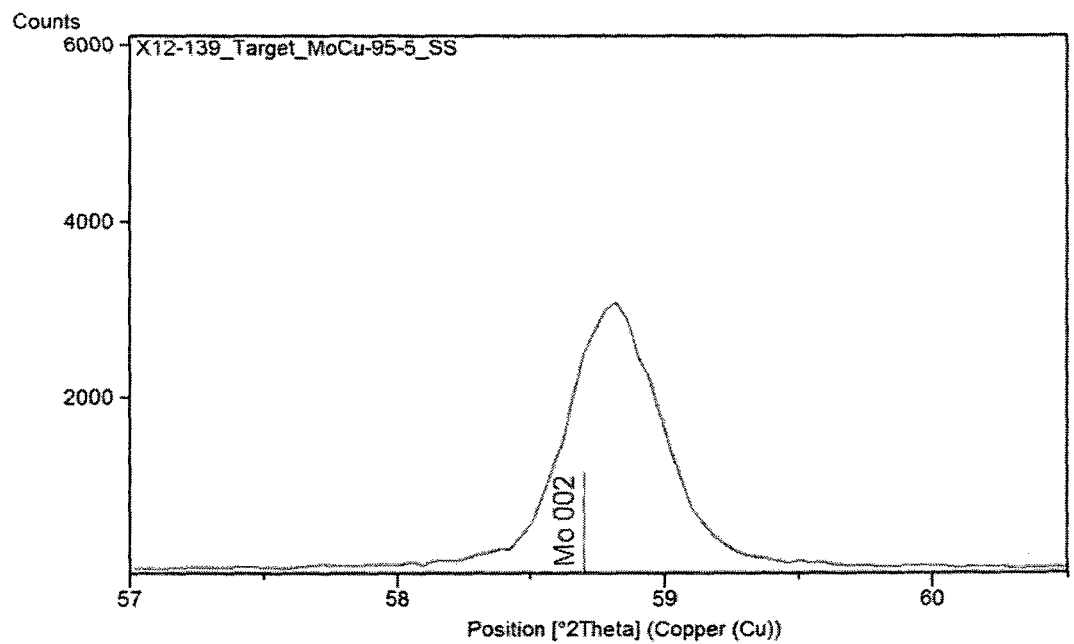
FIG. 5b extract of an XRD analysis of a Mo—Cu target after a one-hour use.

The cathodic spark was then applied to the Mo—Cu targets of different composition for approx. 1 hour in nitrogen atmosphere. After this treatment, the surface of the Mo—Cu targets were again analyzed with XRD and a Rietvelt analysis was performed in order to determine the composition of the target surface as regards Mo and Cu. In this respect, the following was discovered: for all targets of the above composition, there was a displacement of the Mo peak in the x-ray spectrum to wider angles 2Theta, as represented in FIGS. 5a and b for the surface of the Mo (95 at %)-Cu (5 at %). This shift was mostly independent of the target composition. On the other hand, by comparison with the intensity of the initial Cu signal in the untreated target, the result was a considerable reduction thereof, which was partly (though not always) so strong that no Cu at all could be evidenced anymore with XRD in the Theta/2Theta arrangement.

Figure 6:
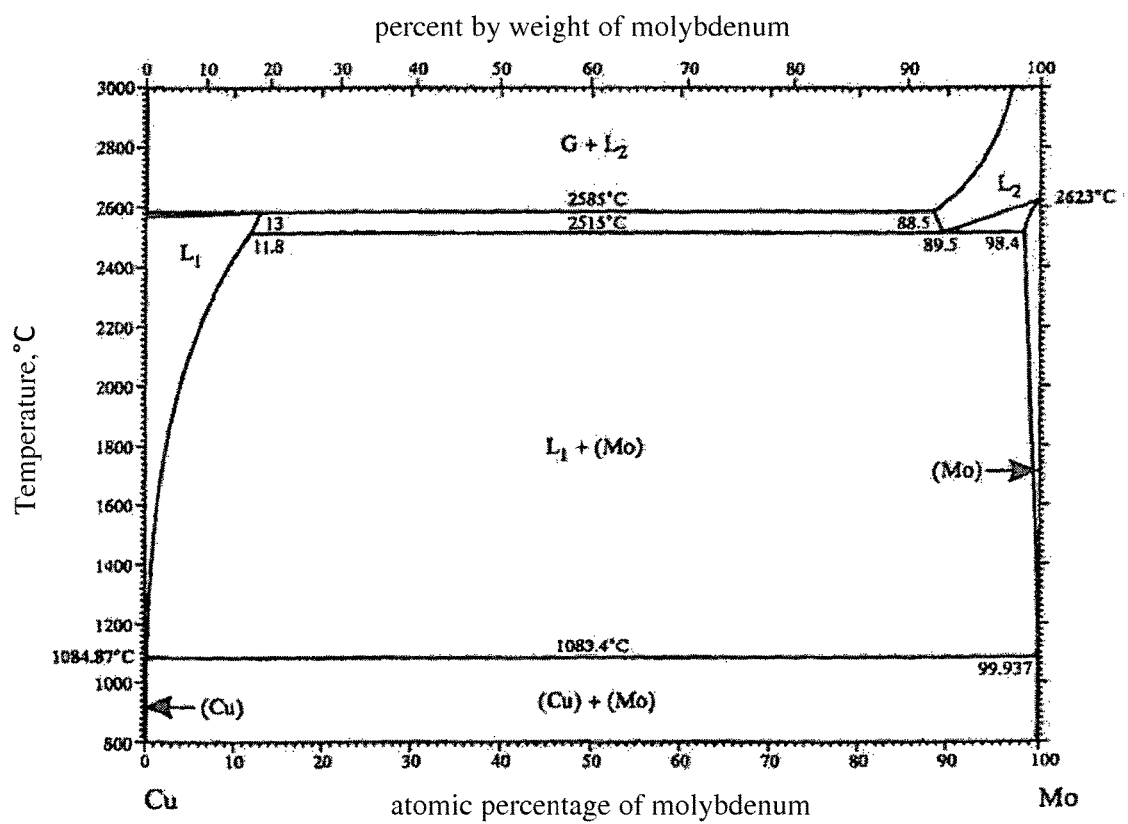
FIG. 6 phase diagram copper molybdenum.

The peak displacement in the XRD spectrum of the Mo can be explained by the binding of a Mo—Cu mixed crystal, if one is to assume a Cu proportion between approx. 2 and 3 at %. This surprisingly matches the Mo—Cu phase diagram that allows the possibility of the formation of such a mixed crystal, but can of course only be used for (thermal) equilibrium states and thus in principle does not apply to spark evaporation. If however the Mo—Cu phase diagram (FIG. 6) is to be used for the purpose of a plausible explanation, one could argue that (depending on the temperature), only limited quantities of Cu (up to approx. 3 at %) can be dissolved in the Mo. Greater quantities of Cu, if they are present in the target, can not be dissolved in Mo over the entire temperature range of the solid Mo phase, i.e. they are inevitably deposited as Cu. This however means that the melting-cooling process that takes place through the cathodic spark extends over broad temperature ranges in which simultaneously the liquid Cu phase and the solid Mo phase are present. This is thus a consequence of the limited dissolvability of the Cu in the Mo and the very different melting points of each. The vapor pressures of both materials also differ from one another very strongly. It is in any case assumed that these facts contribute to the following results:

During manufacture of the target, no intimate connection between the Mo and the Cu can be established in the target, especially not for Cu contents exceeding approx. 4 at %.
   The target surface is transformed from a Mo surface to a Mo—Cu mixed crystal surface through the action of the cathodic spark.

Excess Cu parts are evaporated from the target surface in a greater mass relative to the Mo (different vapor pressure) and result in a depletion of the Cu at the outer target surface.

The very different melting temperatures result in spatters, whose exact formation process is not clear. These could possibly be caused by a liquefaction/evaporation of the Cu under the target surface, i.e. at temperatures at which the Mo is present in a solid phase whilst Cu is liquid.

To sum up, it is possible to say that the limited solubility of the Cu in the Mo and the coexistence of liquid Cu phase and solid Mo phase over broad temperature ranges result in increased spatter generation. The generating of spatters can be influence via the Cu content.

This behavior applies not only for the Mo—Cu material system but also for other material systems that generate such spatters in a very similar manner. These are indicated in table 1. For the elements in brackets in the table, no data was found in the literature, but they supposedly lend themselves in the combination. Crossed-out elements have a melting point that is too low for the target production, are poisonous or radioactive. The elements listed as matrix elements are, in this respect, those elements melting at high temperatures from which the later layer matrix is formed. This layer matrix can be either metallic or comprise a combination with C, N, O or combinations of these elements. The doping elements essentially determine the process of spatter generation via their concentration in the target. The two material groups, the matrix elements and the doping elements, for which this behavior applies, are characterized in tables 2 and 3.

Table 2 indicates the melting points of the matrix elements and the temperatures at which an approximate vapor pressure of 10-2 torr ensues, i.e. under conditions at which perceptible quantities evaporates. For most matrix elements, this temperature lies close to the melting temperature.

In table 3, the corresponding values for the doping elements are indicated. It can be seen in the comparison that there is a temperature difference of approx. 1000° C. between the matrix elements and the doping elements, typically both for the melting temperature as well as for the temperatures at which a vapor pressure of 10-2 torr occurs.

One could then presuppose that all targets of a high-melting material with for example Cu dopings would behave like the Mo—Cu target. This however could not be confirmed. For example, this does not apply for the Zr—Cu, Hf—Cu or Ti—Cu material system. During evaporation of these material systems by means of sparks, spatters will occur but these are integrated considerably better into the synthesized layer and not ejected as was described above for the Mo—Cu system. This also applies to other low-melting dopings in high-melting matrix elements, for example also with Ag in Pt. Al as low-melting material shows this neither in combination with Mo, Ta, W, V nor Zr and is, despite its softness, in all combinations tested to date not suitable as doping material. It would be possible again to resort to the phase diagram to seek the basis for the purpose of a plausible explanation for the fact that these material combinations are not suitable, of course again with the already mentioned above caveat limiting its validity. For all binary material systems in which there is no coexistence between the solid phase of the matrix element and the liquid phase of the doping element over a broad temperature range, because during the transition from the liquidus line towards lower temperatures intermetallic compounds and/or mixed crystals result from the matrix element and the doping element, the process of the layer structuring via the spatters is less pronounced and the spatters have a greater tendency to remain stuck in the layer and become overgrown.

Hereinafter, the loose integration of the spatters on the substrate side, i.e. in the coating, will now be discussed. Here too it is only possible to emit hypotheses, like for the formation of spatters further above. It has been proven that the spatters are not depleted in Cu like the target surface after the meltdown process. The quick expulsion of the spatters from the target surface prevents a complete fusion-bonding of the spatters and they preserve nearly the initial target composition. This would mean that the spatters, when they hit a hot surface, deposit Cu, which because of the low melting point and the high vapor pressure, would not allow good bonding on the matrix layer surface. Another effect, which could be traced back to the processes on the target surface, is however also conceivable. When the areas melted by the spark are quickly cooled down, out of the molten mass first Mo resp. the Mo—Cu mixed crystal will solidify. The released Cu is then still in the liquid phase and at the high temperatures is evaporated accordingly. A large proportion of the vapor condensates and is apparently integrated in the layer (measurements have shown that the layer composition corresponds approximately to the nominal, i.e. initial, target composition), although the manner in which the Cu is integrated depends on the specific reactions that can take place with the process gas and the matrix element. It is however also conceivable that part of the Cu cannot be integrated and is deposited on the surface of the growing layer. Spatters could then be less well able to adhere on the surface occupied with Cu.

As previously mentioned, a surface structuring that is based on the described method and target materials, has a broad range of applications, for example in order to optimize wetting properties of surfaces. However, in the context of this invention we investigated more closely applications that relate to the field of tribology. For example, components of combustion engines were coated and their wear and tear was analyzed. It was shown that a Mo—Cu—N layer drastically reduced the wear and tear under lubricated conditions both of the coated body and of the uncoated counter-body.

The surface structuring used in this respect had the following properties:

The matrix layers were preferably a hard material layer with a HIT of more than 20 GPa, preferably in excess of 25 GPa.

The matrix layer had self-lubricating properties during use, which prevented failure even under conditions of inadequate lubrication.

The matrix layer could easily be freed of spatters using a standard post-treatment.

With this standard post-treatment, a layer surface was achieved that had "trough" structures and is suitable for taking in lubricants.

In the framework of the present invention, a coating method on the basis of physical deposition from the gas phase (CVD, chemical vapor deposition) by means of spark evaporation has been disclosed, with the following steps:

selecting a first target as a material source for the coating;

providing a coating chamber with an arc evaporation source comprising at least the selected target;

loading the coating chamber with substrates to be coated;

pumping down the coating chamber to a process pressure suitable for the arc evaporation;

igniting and operating the spark such that material is evaporated from the first target and is then deposited on the substrates to be coated, optionally after reaction with a reactive gas admitted into the coating chamber;

characterized in that the first target comprises at least one matrix component and one doping component such that the doping component has a melting point at least 600° C. lower than the matrix component, and a melted drop of the doping component does not wet a solid surface of the matrix component.

During the coating process, a melted drop of the doping component on a solid surface of the matrix component can assume a contact angle of a least 90°.

For the coating process, the first target can be chosen such that the matrix component consists of at least one of the elements from a first group formed by Ir, Mo, Nb, Os, Re, Rh, Ta, Ti, V, W, Zr or their alloys.

For the coating method, the first target can be chosen such that the doping component consists of at least one element from a second group formed by Ag, Ca, Ce, Du, Dy, Er, Eu, Gd, La, Mg, Nd, Pb, Sb, Sm, Sr, Tl, Y, Yb, Zn or their alloys.

For the coating method, the first target can be chosen such that the combination of matrix component and doping component is present such that their melting points differ by at least 800° C., preferably by at least 1000° C.

For the coating method, the first target can be chosen such that in the first target, the doping component is present in a higher concentration than it would form a mixed crystal with the matrix component according to the phase diagram.

For the coating method, the coating is advantageously first performed from a second target which essentially does not comprise any doping component and is coated by the first target to deposit a top cover layer.

A method for producing a structured layer has been disclosed, characterized in that a coating method according to one of the preceding claims has been executed and the layer thus created layer is polished so that the spatters present on the layer surface are at least partly removed and recesses with an essentially circular diameter are left behind.

In this method, the spatters can be partly smeared into the recesses.

A target has been disclosed that is suitable as a material source for a CVD coating, wherein the target comprises at least one matrix component and one doping component such that the doping component has a melting point at least 600° C. lower than the matrix component, and a melted drop of the doping component does not wet a solid surface of the matrix component and preferably assumes a contact angle of a least 90°.

In the target, the concentration of the doping component at the target surface can be at least 25% lower in comparison with the concentration of the doping component at a point of reference, wherein the point of reference is located halfway from the target surface to the target reverse side.

A substrate coated with a layer system has been disclosed, wherein the layer system comprises at least one layer that has the spatters characteristic of spark evaporation, characterized in that the surface of the layer has recesses with an essentially circular diameter, which in majority are on the order of one to several hundred nanometers.

For the substrate, the surface of the layer can be formed by a top cover layer and between the top cover layer and the substrate at least one further layer can be provided which has a spatter density showing a lower spatter intensity during the coating by comparison to the surface.

Tables

TABLE 1

| Matrix elements | Doping elements |
| --- | --- |
| Ir | Ag, Cu |
| Mo | Ag, Ca, Ce, Cu, Dy, Er, Eu, Gd, K, La, Mg, Nd, Pb, Sm, Sr, Tl, Yb, Zn and their alloys |
| Nb | Ag, (Ca), Cu, Ce, Eu, Mg, (Sr), Tl, Yb and their alloys |
| Os | Ag, Cu |
| Re | Ag, Cu, Sb and their alloys |
| Rh | Ag |
| Ta | (Ca), Ce, Cu, Dy, Eu, Gd, La, (Mg), Sm, Tl, Yb and their alloys |
| Ti | (Ca), Ce, Dy, Eu, Li and their alloys |
| V | Ag, Ca, Ce, Cu, Dy, Er, Eu, Gd, K, La, Mg, Nd, Sm, Sr, Tl, Yb and their alloys |
| W | Ag, (Ca), Ce, Cu, Dy, Er, Eu, Gd, La, (Mg), Nd, Pb, Sb, Sm, (Sr), Y, Yb and their alloys |
| Zr | (Ca), (Ce), Eu, K, Mg and their alloys |

TABLE 2

| Matrix elements | $T_{SM}$ [C.] | T [C.] for $10^{-2}$ Torr vapor pressure |
| --- | --- | --- |
| Ir | 2466 | 2307 (NES) |
| Mo | 2623 | 2527 |
| Nb | 2477 | 2657 |
| Os | approx. 3130 | approx. 2700 (NES) |
| Re | 3186 | 3067 |
| Rh | 3695 | 2037 |
| Ta | 3017 | 3057 |
| Ti | 1668 | 1737 |
| V | 1910 | approx. 2100 (NES) |
| W | 3422 | 3227 |
| Zr | 1857 | approx. 2700 (NES) |

TABLE 3

| doping element | $T_{SM}$ [C.] | T [C.] for $10^{-2}$ Torr vapor pressure |
| --- | --- | --- |
| Ag | 962 | 1027 |
| Ca | 842 | 597 |
| Ce | 795 | approx. 1450 (NES) |
| Cu | 1085 | 1257 |
| Dy | 1407 | 1117 |
| Er | 1529 | 1177 |
| Eu | 826 | 611 |
| Gd | 1312 | approx. 700 (NES) |
| La | 920 | 1727 |
| Mg | 650 | 439 |
| Nd | 1024 | approx. 1400 (NES) |
| Pb | 327 | 715 |
| Sb | 631 | 533 |
| Sm | 1072 | approx. 750 (NES) |
| Sr | 777 | 537 |
| Tl | 304 | 609 |
| Y | 1526 | 1632 |
| Yb | 824 | 557 |
| Zn | 420 | 344 |

TABLE 4

| Matrix element | oxide | nitride |
| --- | --- | --- |
| Ir | ? | ? |
| Mo | <1000 | <1000 |
| Nb | liquid | |
| Os | | |
| Re | | |
| Rh | | |
| Ta | liquid | |

TABLE 4-continued

| Matrix element | oxide | nitride |
| --- | --- | --- |
| Ti | liquid | |
| V | <1000 | |
| W | | <1000 |
| Zr | | |

What is claimed is:

1. Coating method on the basis of physical deposition from the gas phase by means of spark evaporation, with the following steps:
    selecting a first target as a material source for a coating;
    providing a coating chamber with an arc evaporation source comprising at least the selected target;
    loading the coating chamber with substrates to be coated;
    pumping down the coating chamber to a process pressure suitable for the arc evaporation;
    igniting and operating a spark such that material is evaporated from the first target and is then deposited on the substrates to be coated;
    characterized in that the first target comprises at least one matrix component and one doping component such that the doping component has a melting point at least 600° C. lower than the matrix component, and a melted drop of the doping component does not wet a solid surface of the matrix component.

2. The coating method according to claim 1, characterized in that the melted drop of the doping component on a solid surface of the matrix component assumes a contact angle of a least 90°.

3. The coating method according to claim 1, characterized in that the first target is chosen such that the matrix component consists of at least one of the elements from a first group formed by Ir, Mo, Nb, Os, Re, Rh, Ta, Ti, V, W, Zr or their alloys.

4. The coating method according to claim 1, characterized in that the first target is chosen such that the doping component consists of at least one element from a second group formed by Ag, Ca, Ce, Du, Dy, Er, Eu, Gd, La, Mg, Nd, Pb, Sb, Sm, Sr, Tl, Y, Yb, Zn or their alloys.

5. The coating method according to claim 1, characterized in that the first target is chosen such that the combination of matrix component and doping component is present such that their melting points differ by at least 800° C.

6. The coating method according to claim 5, wherein the melting points differ by at least 1000° C.

7. The coating method according to claim 1, characterized in that in the first target, the doping component is present in a higher concentration than it can form a mixed crystal with the matrix component according to the phase diagram.

8. The coating method according to claim 1, characterized in that the coating is advantageously first performed from a second target which essentially does not comprise any doping component and is coated by the first target to deposit a top cover layer.

9. The coating method according to claim 1, wherein the step of igniting and operating the spark is performed after reaction with a reactive gas admitted into the coating chamber.

10. Method for producing a structured layer, characterized in that the coating method according to claim 1 further comprises polishing the material deposited on the substrates to at least partly remove spatters integrated into a surface layer of the material and form recesses with an essentially circular diameter, wherein the spatters were integrated into the surface layer of the material when the material was deposited on the substrate.

11. Method according to claim 10, characterized in that a portion of the spatters remain in the recesses after polishing.

* * * * *